United States Patent
Lin et al.

(10) Patent No.: US 10,109,559 B2
(45) Date of Patent: Oct. 23, 2018

(54) ELECTRONIC DEVICE PACKAGE AND FABRICATION METHOD THEREOF

(71) Applicant: XINTEC INC., Zhongli, Taoyuan County (TW)

(72) Inventors: Chia-Sheng Lin, Zhongli (TW); Yen-Shih Ho, Kaohsiung (TW); Tsang-Yu Liu, Zhubei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/470,159

(22) Filed: Aug. 27, 2014

(65) Prior Publication Data

US 2015/0061102 A1     Mar. 5, 2015

Related U.S. Application Data

(60) Provisional application No. 61/872,089, filed on Aug. 30, 2013.

(51) Int. Cl.
    *H01L 23/48*      (2006.01)
    *H01L 23/00*      (2006.01)
    (Continued)

(52) U.S. Cl.
    CPC ...... *H01L 23/481* (2013.01); *H01L 21/76898* (2013.01); *H01L 24/03* (2013.01);
    (Continued)

(58) Field of Classification Search
    CPC ..................................................... H01L 24/24
    (Continued)

(56) References Cited

U.S. PATENT DOCUMENTS

2009/0255705 A1* 10/2009 Pratt .................. H01L 23/481
    174/98
2011/0210413 A1* 9/2011 Huang ................ H01L 23/3171
    257/433
(Continued)

FOREIGN PATENT DOCUMENTS

CN      101232033      7/2008
CN      101589468      11/2009
(Continued)

*Primary Examiner* — Moazzam Hossain
*Assistant Examiner* — Hajar Kolahdouzan
(74) *Attorney, Agent, or Firm* — Liu & Liu

(57) ABSTRACT

An electronic device package and fabrication method thereof is provided. First, a semiconductor substrate is provided and the upper surface of it is etched to from recesses. A first isolation layer is formed on the upper surface and the sidewalls of the recesses. A conductive part is formed to fulfill the recesses and a conductive pad is formed on the first isolation layer to connect the conductive part. An electronic device is combined with the semiconductor substrate on the supper surface, wherein the electronic device has a connecting pad electrically connected to the conductive pad. The semiconductor substrate is thinned form its lower surface to expose the conductive part. A second isolation layer is formed below the lower surface and has an opening to expose the conductive part. A redistribution metal line is formed below the second isolation layer and in the opening to electrically connect to the conductive part.

19 Claims, 7 Drawing Sheets

(51) Int. Cl.
  *H01L 21/768* (2006.01)
  *H01L 27/146* (2006.01)
  *H01L 31/02* (2006.01)
  *H01L 23/31* (2006.01)

(52) U.S. Cl.
  CPC .......... *H01L 24/05* (2013.01); *H01L 27/1469* (2013.01); *H01L 27/14618* (2013.01); *H01L 27/14683* (2013.01); *H01L 31/02005* (2013.01); *H01L 23/3114* (2013.01); *H01L 24/13* (2013.01); *H01L 2224/02372* (2013.01); *H01L 2224/0345* (2013.01); *H01L 2224/0346* (2013.01); *H01L 2224/0391* (2013.01); *H01L 2224/0401* (2013.01); *H01L 2224/05008* (2013.01); *H01L 2224/05155* (2013.01); *H01L 2224/05164* (2013.01); *H01L 2224/05548* (2013.01); *H01L 2224/05558* (2013.01); *H01L 2224/05567* (2013.01); *H01L 2224/05583* (2013.01); *H01L 2224/05624* (2013.01); *H01L 2224/05644* (2013.01); *H01L 2224/05647* (2013.01); *H01L 2224/05655* (2013.01); *H01L 2224/13022* (2013.01); *H01L 2224/13024* (2013.01); *H01L 2224/13111* (2013.01); *H01L 2924/1204* (2013.01); *H01L 2924/12042* (2013.01); *H01L 2924/12043* (2013.01)

(58) Field of Classification Search
  USPC ........................................................ 257/692
  See application file for complete search history.

(56) References Cited

U.S. PATENT DOCUMENTS

| | | | | |
|---|---|---|---|---|
| 2011/0233782 | A1* | 9/2011 | Chang et al. | 257/753 |
| 2012/0146209 | A1* | 6/2012 | Hu | H01L 23/36 257/692 |
| 2013/0069188 | A1* | 3/2013 | Chen | H01L 27/14605 257/432 |

FOREIGN PATENT DOCUMENTS

| | | |
|---|---|---|
| CN | 101999168 | 3/2011 |
| CN | 102543927 | 7/2012 |
| CN | 102651350 | 8/2012 |
| CN | 103066081 | 4/2013 |
| CN | 103137566 | 6/2013 |
| TW | 201041469 | 11/2010 |
| TW | 201143128 | 12/2011 |
| TW | 201225762 | 6/2012 |

* cited by examiner

ELECTRONIC DEVICE PACKAGE AND FABRICATION METHOD THEREOF

RELATED APPLICATIONS

This application claims priority to U.S. provisional Application Ser. No. 61/872,089, filed Aug. 30, 2013, which is herein incorporated by reference.

BACKGROUND

Field of Invention

The present invention relates to a package and a method for manufacturing thereof. More particularly, the present invention relates to an electronic device package and a method for manufacturing thereof.

Description of Related Art

Requirements on electronic products are becoming challenging in consumers market, and therefore devices such as CMOS image sensors (CIS) applied in those electronic products are keeping developed. Among various technologies in CISs, backside Illumination (BSI) technologies is gradually emerging and becoming a focus on CISs technologies. Traditional CISs are fabricated in frontside Illumination (FSI) technology. In FSI technology, an optical diode is fabricated in front-end-of-line (FEOL), and inter-connections are fabricated in back-end-of-line (BEOL). The interconnections are disposed above the optical diode. Therefore, lights pass through the interconnections before arrive the optical diode, and therefore interferences might occur before the optical diode detects the lights. Accordingly, resolution of traditional CISs fabricated in FSI is limited. In contrast, in BSI technology, the optical diode and the interconnections are flipped upside down in a flip packaging, and therefore lights could directly arrive the optical diode without passing through the interconnections. The flip packaging could also be applied in various device packages in addition to CIS device package. Accordingly, a more reliable electronic device package and a fabrication method thereof, which is more suitable for mass production, have become one of important issues in electronics industry.

SUMMARY

The present disclosure provides an electronic device package and a fabrication method thereof. The method of fabricating the electronic device package has simplified process operations and increased process margin such that the conductive path within the device package could be formed effectively. Therefore, the device package fabricated has higher reliability and lower cost than those of prior arts. In addition, the layout design of the connecting pads of the device could be more flexible for optimizing efficiency of the device.

The present disclosure, in one aspect, relates to an electronic device package. The electronic device package includes a semiconductor substrate, at least one via, a first isolation layer, a conductive part, a conducting pad, an electronic device, a second isolation layer, at least one redistribution metal line. The semiconductor substrate has an upper surface and a lower surface. The via is through the upper surface and the lower surface. The first isolation layer is disposed on the upper surface and a sidewall of the via. The conductive part is disposed in the via. The conducting pad is disposed on the first isolation layer, and has a connecting surface with the conductive part. The electronic device is disposed on the upper surface, wherein the device has at least one first connecting pad electrically connected to the conducting pad. The second isolation layer is disposed below the lower surface. The second isolation layer has at least one opening to expose the conductive part. The redistribution metal line is disposed below the second isolation layer, and a part of the redistribution metal line is disposed in the opening to be electrically connected to the conductive part. The connecting surface is aligned top of the via.

In various embodiments of the present disclosure, the electronic device package further includes an inter-connection layer. The inter-connection layer is disposed on the first isolation layer and the conducting pad, the inter-connection layer having at least one inter-connection and at least one second connecting pad, wherein the second connecting pad is connected to the first connecting pad, and the inter-connection is connected to the second connecting pad and the conducting pad.

In various embodiments of the present disclosure, the electronic device package further includes a solder mask layer and at least one solder ball. The solder mask is disposed below the second isolation layer and the redistribution metal line. The solder mask layer has at least one opening to expose the redistribution metal line. The solder ball is disposed in the opening to electrically connect the redistribution metal line.

In various embodiments of the present disclosure, the electronic device package further includes an under bump metallization, a solder mask layer, and at least one solder ball. The under bump metallization is disposed below the redistribution metal line and covering the redistribution metal line. The solder mask layer is disposed below the second isolation layer and the under bump metallization. The solder mask layer has at least one opening to expose the under bump metallization. The solder ball is disposed in the opening to be electrically connected to the under bump metallization.

In various embodiments of the present disclosure, the under bump metallization includes a nickel layer, and a gold layer. The nickel layer covers the redistribution metal line. The gold layer covers the nickel layer.

In various embodiments of the present disclosure, the under bump metallization includes a nickel layer, a palladium layer, and a gold layer. The nickel layer covers the redistribution metal line. The palladium layer covers the nickel layer. The gold layer covers the palladium layer.

In various embodiments of the present disclosure, the electronic device package further includes at least one dam, and a protection lid. The dam is disposed on the device. The dam is disposed between the protection lid and the device.

In various embodiments of the present disclosure, the electronic device package further includes a tape. The tape is disposed on the device.

In various embodiments of the present disclosure, the first isolation layer and the second isolation layer include silicon oxide, silicon nitride, silicon oxynitride, or combinations thereof.

The present disclosure, in another aspect, relates to a method of fabricating a device package. The method includes providing a semiconductor substrate having an upper surface and a lower surface. The method further includes etching the upper surface of the semiconductor substrate to form at least one recess. The method further includes forming a first isolation layer on the upper surface and a sidewall of the recess. The method further includes forming a conductive part disposed in the recess, and a conducting pad on the first isolation layer to connect the conductive part. The method further includes combining a device to the upper surface of the semiconductor substrate, wherein the device has at least one first connecting pad electrically connecting to the conducting pad. The method further includes thinning the semiconductor substrate from the lower surface to the upper surface. The conductive part disposed in the recess is exposed. The method further includes forming a second isolation layer below the lower surface, wherein the second isolation layer has at least one opening to expose the conductive part. The method further includes forming at least one redistribution metal line below the second isolation layer. A part of the redistribution metal line disposed in the opening is electrically connected to the conductive part.

In various embodiments of the present disclosure, before combining the device to the upper surface of the semiconductor substrate, the method further includes forming an inter-connection layer on the first isolation layer and the conducting pad, wherein the inter-connection layer has at least one inter-connection and at least one second connecting pad, the second connecting pad is connected to the first connecting pad, and the inter-connection is connected to the second connecting pad and the conducting pad.

In various embodiments of the present disclosure, the method further includes forming a solder mask layer below the second isolation layer and the redistribution metal line, wherein the solder mask layer has at least one opening to expose the redistribution metal line. The method further includes forming at least one solder ball disposed in the opening to electrically connect the redistribution metal line.

In various embodiments of the present disclosure, before forming the solder mask layer, the method further includes forming an under bump metallization covering the redistribution metal line.

In various embodiments of the present disclosure, the forming the under bump metallization is performed by sputtering, vapor deposition, or electroplating.

In various embodiments of the present disclosure, the under bump metallization include a nickel layer and a gold layer. The nickel layer covers the redistribution metal line. The gold layer covers the nickel layer.

In various embodiments of the present disclosure, the under bump metallization include a nickel layer, a palladium layer, and a gold layer. The nickel layer covers the redistribution metal line. The palladium layer covers the nickel layer. The gold layer covers the palladium layer.

In various embodiments of the present disclosure, the method further includes forming at least one dam disposed on the device. The method further includes forming a protection lid. The dam is disposed between the protection lid and the device.

In various embodiments of the present disclosure, the method further includes attaching a tape on the device.

In various embodiments of the present disclosure, forming the first isolation layer and forming the second isolation layer are performed by chemical vapor deposition or spin coating, and the first isolation layer and the second isolation layer comprises silicon oxide, silicon nitride, silicon oxynitride, or combinations thereof.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
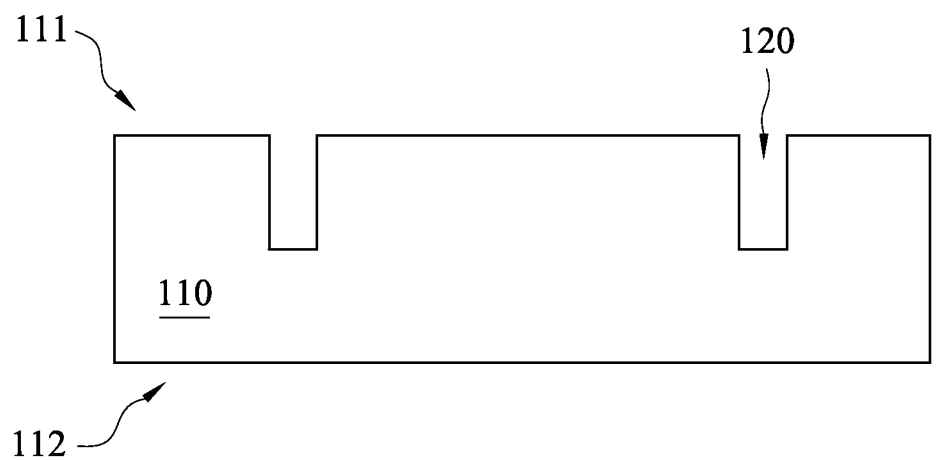
FIG. 1 is a schematic view of at least a portion of the substrate in an intermediate stage of the method of fabricating the chip package according to various embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

FIGS. 1-6 are schematic view of different stages of the method of fabricating the chip package according to various embodiments of the present disclosure. FIG. 1 is a schematic view of at least a portion of the substrate in an intermediate stage of the method of fabricating the chip package according to various embodiments of the present disclosure. Referring to FIG. 1, a semiconductor substrate 110 is provided. The semiconductor substrate 110 has an upper surface 111 and a lower surface 112. The upper surface 111 of the semiconductor substrate 110 is etched to form at least one recess 120. The semiconductor substrate 110 could be regarded as a carrier substrate, and provides carrying forces required in following processes. The semiconductor substrate 110 could include, but not limited to silicon, germanium, or other III-V group elements. The upper surface 111 of the semiconductor substrate 110 could be etched by dry-etching or laser drilling. Etching is performed from the upper surface 111 to the lower surface 112 to form one or a plurality of recesses 120. The shape of the recess 120 could be cylinder as shown in FIG. 1. However, the present disclosure is not limited thereto. The shape of the recess 120 also could be cone with wider top. The shape of the recess 120 could be well adjusted according to various requirements and processes limitations.

Figure 2:
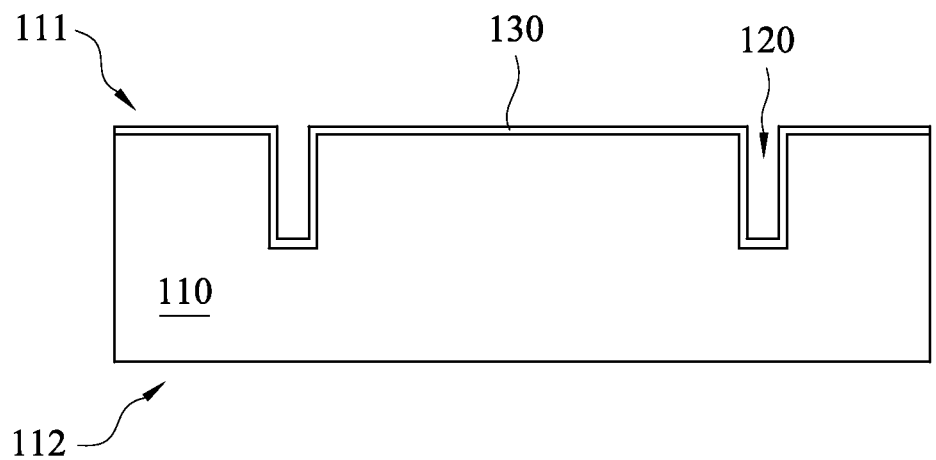
FIG. 2 is a schematic view of the substrate shown in FIG. 1 in a subsequent stage of the method of fabricating the chip package according to various embodiments of the present disclosure.

FIG. 2 is a schematic view of the substrate shown in FIG. 1 in a subsequent stage of the method of fabricating the chip package according to various embodiments of the present disclosure. Referring to FIG. 2, a first isolation layer 130 is formed on the upper surface 111 and a sidewall of the recess 120. The first isolation layer 130 could be silicon oxide, silicon nitride, silicon oxynitride, or other suitable isolation materials. The first isolation layer 130 could be formed by chemical vapor deposition (CVD), or spin on dielectric (SOD). However, the present disclosure is not limited thereto. The first isolation layer 130 formed on the upper surface 111 and the sidewall of the recess 120 could provide isolation and stress buffering between the semiconductor substrate 110 and the conductive materials formed in following processes. It should be noticed that the first isolation layer 130 could cover a bottom of the recess 120 as shown in FIG. 2. However, the present disclosure is not limited thereto. It is also harmless that the first isolation layer 130 could not be formed to cover the bottom of the recess 120. It is well known that forming a thin film covering the bottom of the recess is challenging in thin film processes, and expensive tools or complicated process is required to form the thin film covering the bottom of the recess. However, the method of fabricating the chip package according to various embodiments of the present disclosure would not be impacted if the first isolation layer 130 could not cover the bottom of the recess 120. The details are described in following paragraphs.

Figure 3:
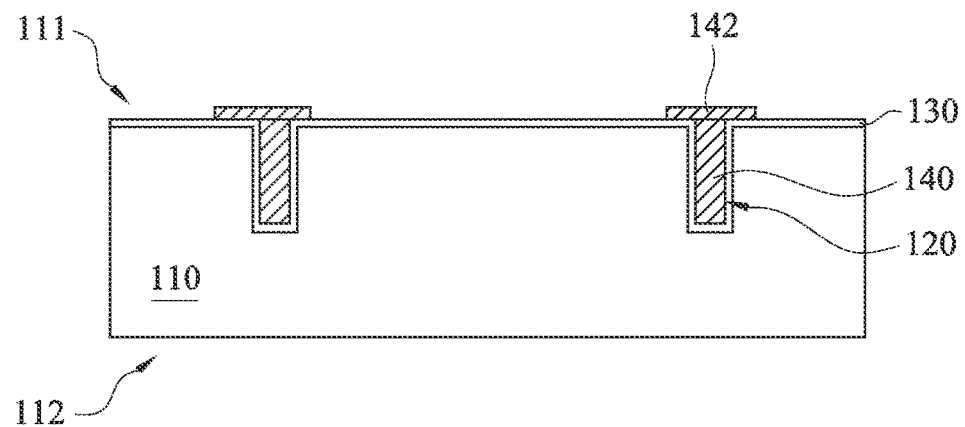
FIG. 3 is a schematic view of the substrate shown in FIG. 2 in a subsequent stage of the method of fabricating the chip package according to various embodiments of the present disclosure.

FIG. 3 is a schematic view of the substrate shown in FIG. 2 in a subsequent stage of the method of fabricating the chip package according to various embodiments of the present disclosure. Referring to FIG. 3, a conductive part 140 is formed to fulfill the recess 120, and a conducting pad 142 is formed on the first isolation layer 130 to connect the conductive part 140. The conductive part 140 and the conducting pad 142 could include aluminum, copper, nickel, conductive polymer, or other suitable conductive materials. The conductive part 140 and the conducting pad 142 could be formed by sputtering, evaporating, electroplating, or electroless plating. The conductive part 140 could include the same materials with those of the conducting pad 142. The conductive part 140 and the conducting pad 142 could be formed in the same stage. For example, a conductive material is fulfilled in the recess 120, and the conductive material is also deposited as a conductive film covering the first isolation layer 130. Then the conductive film is etched to form the conducting pad 142 connecting to the conductive part 140. The conductive part 140 could include different materials form those of the conducting pad 142, and the conductive part 140 and the conducting pad 142 could be formed in the several stages. For example, a conductive material is fulfilled in the recess 120 first, then another conductive material is deposited on the first isolation layer 130 to form a conductive film covering the first isolation layer 130. Then the conductive film is etched to form the conducting pad 142 connecting to the conductive part 140. However, the present disclosure is not limited thereto. The conducting pad 142 is disposed on the upper surface 111 of the semiconductor substrate 110, and the conducting pad 142 is electrically connected to a device combined in following stages. The conductive part 140 is a vertical electrical conducting path through the upper surface and the lower surface of the semiconductor substrate 110.

Figure 4:
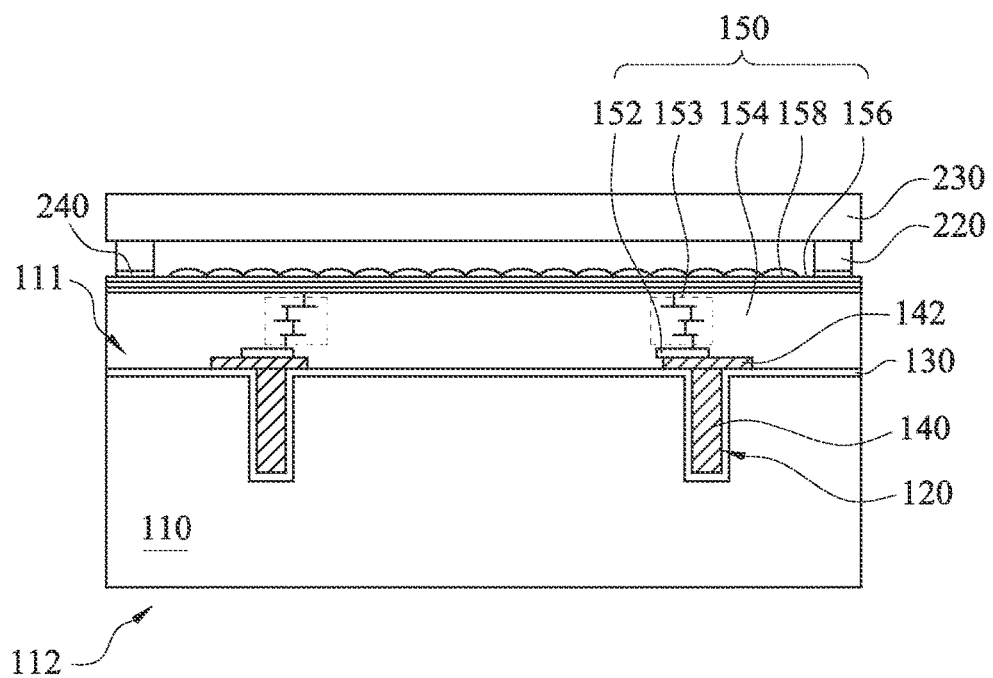
FIG. 4 is a schematic view of the substrate shown in FIG. 3 in a subsequent stage of the method of fabricating the chip package according to various embodiments of the present disclosure.

FIG. 4 is a schematic view of the substrate shown in FIG. 3 in a subsequent stage of the method of fabricating the chip package according to various embodiments of the present disclosure. Referring to FIG. 4, a device 150 is combined to the upper surface 111 of the semiconductor substrate 110. The device 150 has at least one first connecting pad 152 electrically connected to the conducting pad 142 as illustrated in FIG. 4. The device 150 could be a backside illumination sensor (BSI) having a first connecting pad 152, an inter-connection structure 153, an inter-connection dielectric layer 154, a color filter (not shown), a photodiode 156, and a micro-lens 158. The micro-lens 158 receives lights through the color filter, and the photodiode 156 generates current signals. The current signals are transferred by the inter-connection structure 153 in the inter-connection dielectric layer 154, and transmitted into the first connecting pad 152, which is close to the upper surface 111 of the semiconductor substrate 110. The current signals are finally transmitted into the conducting pad 142 and the conductive part 140 which are electrically connected to the first connecting pad 152. In other words, the device 150 and the conductive part 140 are electrically connected with a conductive path formed by the first connecting pad 152 and the conducting pad 142. Therefore, the current signals generated form the device 150, which is disposed on the upper surface 111 of the semiconductor substrate 110, could be conducted to the lower surface 112 of the semiconductor substrate 110. The device 150 also could include active or passive elements, electronic components, other opto electronic devices, micro electro mechanical systems (MEMS), micro fluidic systems, physical sensors, image sensors, light-emitting diodes, solar cells, RF circuits, accelerators, gyroscopes, micro actuators, surface acoustic wave components, pressure sensors, or ink printer heads. However, the present disclosure is not limited thereto.

Figure 5:
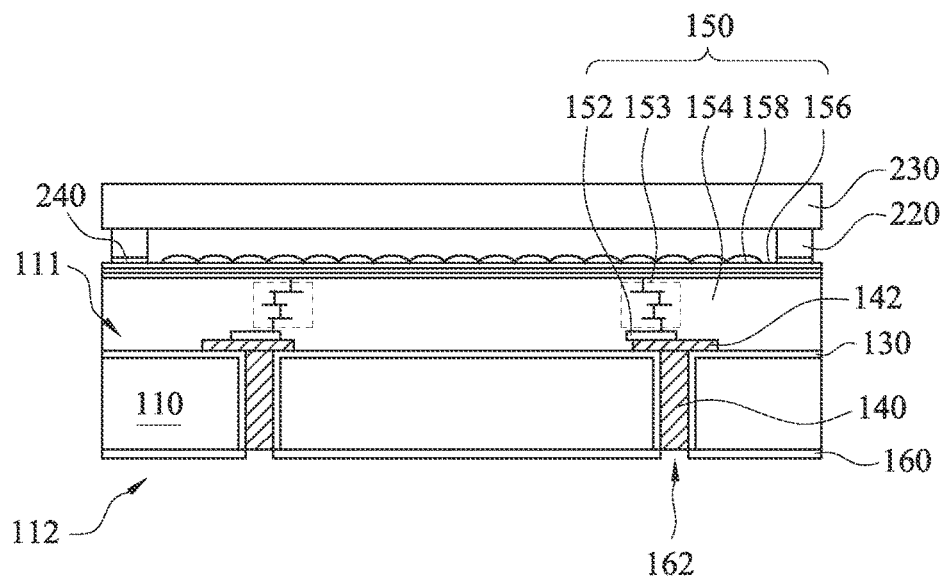
FIG. 5 is a schematic view of the substrate shown in FIG. 4 in a subsequent stage of the method of fabricating the chip package according to various embodiments of the present disclosure.

FIG. 5 is a schematic view of the substrate shown in FIG. 4 in a subsequent stage of the method of fabricating the chip package according to various embodiments of the present disclosure. Referring to FIG. 5, the semiconductor is thinned from the lower surface 112 to the upper surface 111, and therefore the conductive part 140 disposed in the recess 120 is exposed. The operation of thinning the semiconductor substrate 110 could be performed by chemical-mechanical polishing (CMP), dry etching, or other suitable processes. However, the present disclosure is not limited thereto. It should be noticed that the operation of thinning the semiconductor substrate 110 exposes the conductive part 140, which is formed in the recess 120, and the vertical conductive path, a through-silicon via (TSV), through the upper surface 111 and the lower surface 112 is formed. Generally, the vertical conductive path is formed by thinning the semiconductor substrate, etching the semiconductor substrate to form a via, and finally fulfilling the via with a conductive material. Among these operations, etching the semiconductor substrate to form the via is performed by etching form a surface to the other surface of the semiconductor substrate, and the etching process has to precisely aim to the conducting pad disposed on the other surface. Therefore, misalignment between the via and the conducting pad disposed on the other surface are easily occurs, and therefore the vertical conductive path is failed to be formed. According to various embodiments of the present disclosure, the device 150 is face-to face connected to the conductive part 140 and the conducting pad 142 as illustrated in FIG. 4. Therefore, fabrication of the vertical conductive path through the upper surface 111 and the lower surface 112 is simplified, and the limitations caused by precision of processes are avoided. Accordingly, conductive path of the device 150 in the chip package according to various embodiments of the present disclosure could be formed in a higher yield than that of prior arts. In addition, in prior arts, over-etching is required in forming via through the semiconductor substrate such that exposing the conductive pads could be ensured. Therefore, excess metal loss on some conductive pads is inevitable, and reliability on these conductive pads is reduced accordingly. In contrast, according to various embodiments of the present disclosure, the conductive part 140 and the conducting pad 142 are formed after etching the upper surface 111 of the semiconductor substrate 110 to form the recess 120. Therefore, a connecting surface between the conductive part 140 and the conducting pad 142 is aligned top of the via formed in the recess 120. Therefore, excess metal loss on the conducting pad 142 is avoided, and the reliability of the chip package could be significantly improved.

Referring to FIG. 5 and FIG. 2, it should be also noticed that even if the first isolation layer 130 is not formed to cover the bottom of the recess 120, the method of fabricating the chip package according to various embodiments of the present disclosure is not impacted. As aforementioned, it is well known that forming a thin film covering the bottom of the recess is challenging in thin film processes, and expensive tools or complicated process is required to form the thin film covering the bottom of the recess. Since the bottom of the recess 120 is polished away in the operation of thinning the semiconductor substrate 110 from the lower surface 112 to expose the conductive part 140 in the recess 120 from the lower surface 112 such that the vertical conductive path through the semiconductor substrate 110 is formed. Therefore, process window of the method of fabricating the chip package according to various embodiments of the present disclosure is significantly improved. In addition, since the method of fabricating the chip package according to various embodiments of the present disclosure has simpler steps than those of prior arts, cost on fabricating the chip package could be further reduced. As illustrated in FIG. 5, a second isolation layer 160 is formed below the lower surface 112. The second isolation layer 160 has at least one opening 162 to expose the conductive part 140. The second isolation layer 160 could include silicon oxide, silicon nitride, silicon oxynitride, or other suitable isolation materials. The second isolation layer 160 could be formed by chemical vapor deposition, or spin on dielectric. However, the present disclosure is not limited thereto. The second isolation layer 160 is formed below the lower surface 112 to provide electrical isolation and stress buffering between the semiconductor substrate 110 and the redistribution metal line 170 formed in following operations.

Figure 6:
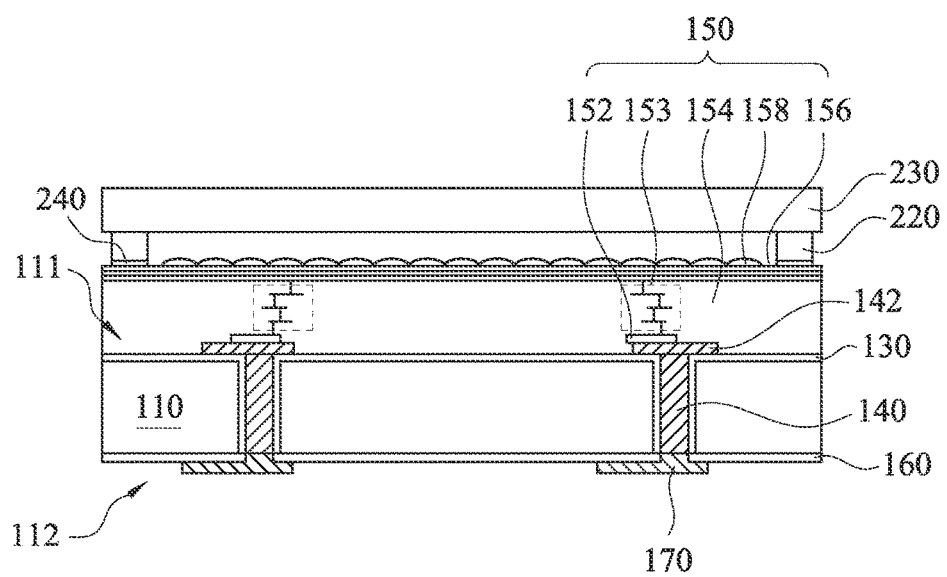
FIG. 6 is a schematic view of the substrate shown in FIG. 5 in a subsequent stage of the method of fabricating the chip package according to various embodiments of the present disclosure.

FIG. 6 is a schematic view of the substrate shown in FIG. 5 in a subsequent stage of the method of fabricating the chip package according to various embodiments of the present disclosure. Referring to FIG. 6, at least one redistribution metal line 170 is formed below the second isolation layer 160. A part of the redistribution metal line 170 disposed in the opening 162 is electrically connected to the conductive part 140. The redistribution metal line 170 could include aluminum, copper, nickel, conductive polymer, or other suitable conductive materials. The redistribution metal line 170 could be formed by sputtering, evaporating, electroplating, or electroless plating a conductive film, and litho-etching the conductive film with a predetermined layout corresponding to the conductive part 140 in the opening 162.

Figure 7:
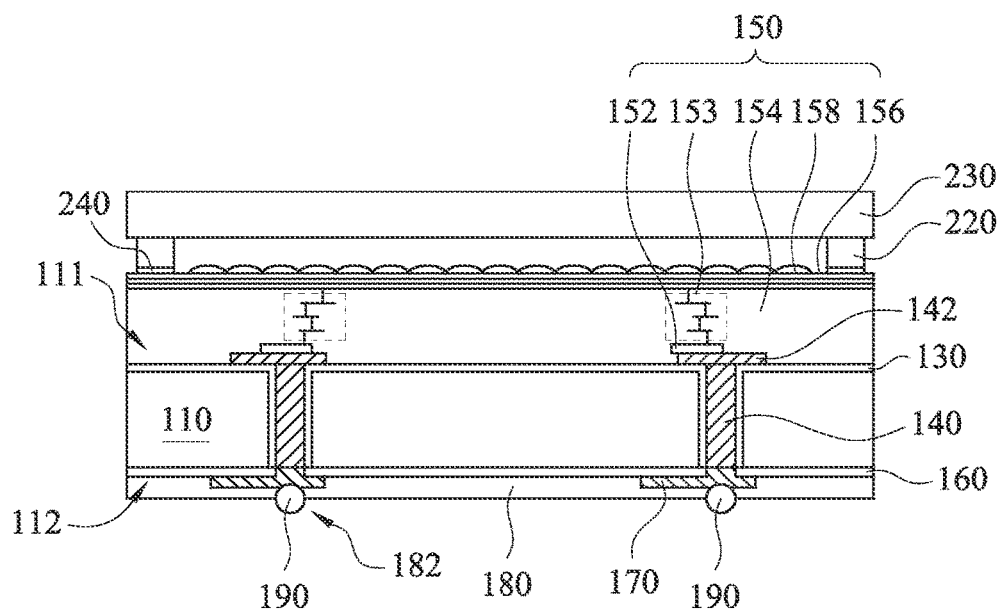
FIG. 7 is a schematic view of the substrate shown in FIG. 6 in a subsequent stage of the method of fabricating the chip package according to various embodiments of the present disclosure.

FIG. 7 is a schematic view of the substrate shown in FIG. 6 in a subsequent stage of the method of fabricating the chip package according to various embodiments of the present disclosure. Referring to FIG. 7, a solder mask layer 180 is formed below the second isolation layer 160 and the redistribution metal line 170. The solder mask layer 180 has at least one opening 182 to expose the redistribution metal line 170. At least one solder ball 190 is formed in the opening 182 to electrically connect the redistribution metal line 170. The solder mask layer 180 could include solder mask, and the solder ball 190 could include tin (Sn) or other suitable soldering materials. The solder ball 190 could further electrically connect to a printed circuit board (PCB). The PCB could input and/or output signals to the device 150 in the chip package. The solder ball 190 also could further electrically connect to other semiconductor chips or interposers, and therefore the chip package is integrated as a 3D-IC stacking structure.

Figure 8:
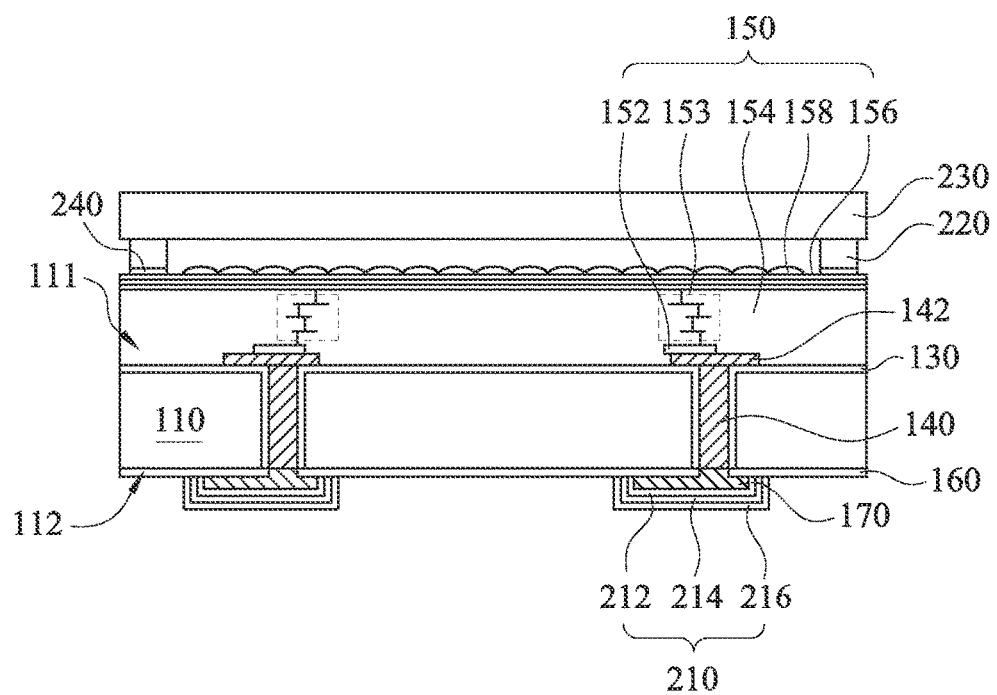
FIG. 8 is a schematic view of the substrate shown in FIG. 6 in a subsequent stage of the method of fabricating the chip package according to other various embodiments of the present disclosure.

FIG. 8 is a schematic view of the substrate shown in FIG. 6 in a subsequent stage of the method of fabricating the chip package according to other various embodiments of the present disclosure. Referring to FIG. 8, a under bump metallization 210 is formed covering the redistribution metal line 170. The under bump metallization 210 can effectively avoid failure of connecting redistribution metal line 170 with the solder ball 190 or a bonding-wire. The under bump metallization 210 could include nickel (Ni) layer 212, which has low consumption rate, to cover the redistribution metal line 170 as a barrier layer. The barrier layer reduces diffusion between the redistribution metal line 170 and the solder ball 190 or the bonding-wire, and risk of forming an intermetallic compound is accordingly reduced. Therefore, bonding fail caused by the intermetallic compound could be avoided. Furthermore, a gold (Au) layer 216 could be formed on the nickel layer 212 as an anti-oxidation layer of the nickel layer 212 since nickel has a higher oxidation potential. As illustrated in FIG. 8, in various embodiments of the present disclosure, the under bump metallization 210 includes a nickel layer 212, a palladium layer 214, and a gold layer 216. The nickel layer 212 covers the redistribution metal line 170. The palladium layer 214 covers the nickel layer 212. The gold layer 216 covers the palladium layer 214. In order to form a good ohmic contact between the under bump metallization 210 and the redistribution metal line 170, a dry clean or wet etching could be performed on the redistribution metal line 170 to remove native oxides on the redistribution metal line 170 before forming the under bump metallization 210. The under bump metallization 210 could be formed by evaporation, sputtering, or chemical plating to form a metal layer, and litho-etching the metal layer. However, the present disclosure is not limited thereto.

Figure 9:
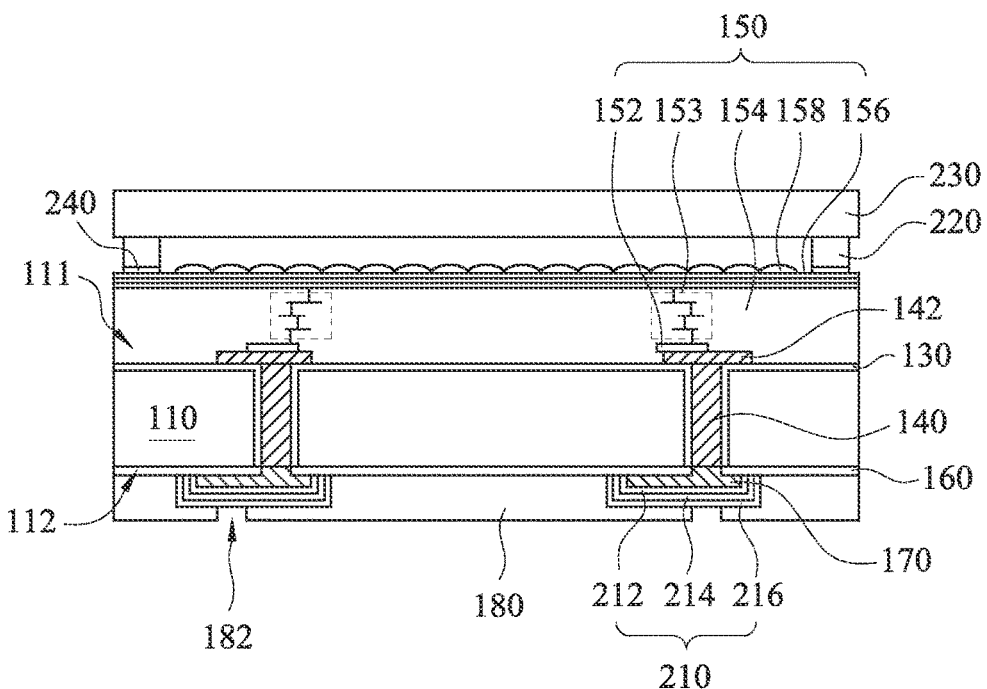
FIG. 9 is a schematic view of the substrate shown in FIG. 8 in a subsequent stage of the method of fabricating the chip package according to other various embodiments of the present disclosure.

FIG. 9 is a schematic view of the substrate shown in FIG. 8 in a subsequent stage of the method of fabricating the chip package according to other various embodiments of the present disclosure. Referring to FIG. 9, a solder mask layer 180 is formed below the second isolation layer 160 and the redistribution metal line 170. The solder mask layer 180 has at least one opening 182 to expose the redistribution metal line 170. Furthermore, a solder ball or a bonding-wire could be formed in the opening 182, and a PCB could be electrically connected to the solder ball or the bonding-wire. The PCB could input and/or output signals to the device 150 in the chip package. The solder ball or the bonding-wire also could further electrically connect to other semiconductor chips or interposers, and therefore the chip package is integrated as a 3D-IC stacking structure.

Figure 10:
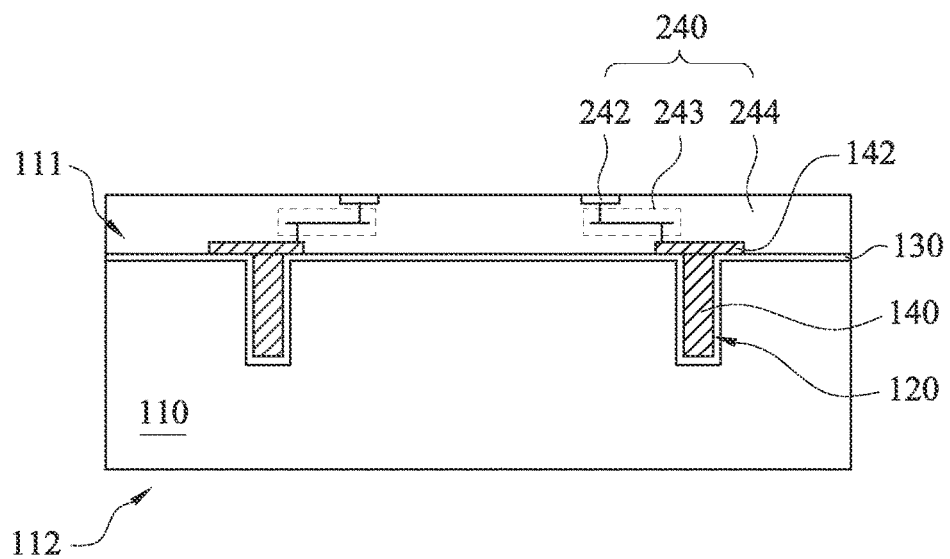
FIG. 10 is a schematic view of the substrate shown in FIG. 3 in a subsequent stage of the method of fabricating the chip package according to another various embodiments of the present disclosure.
Figure 11:
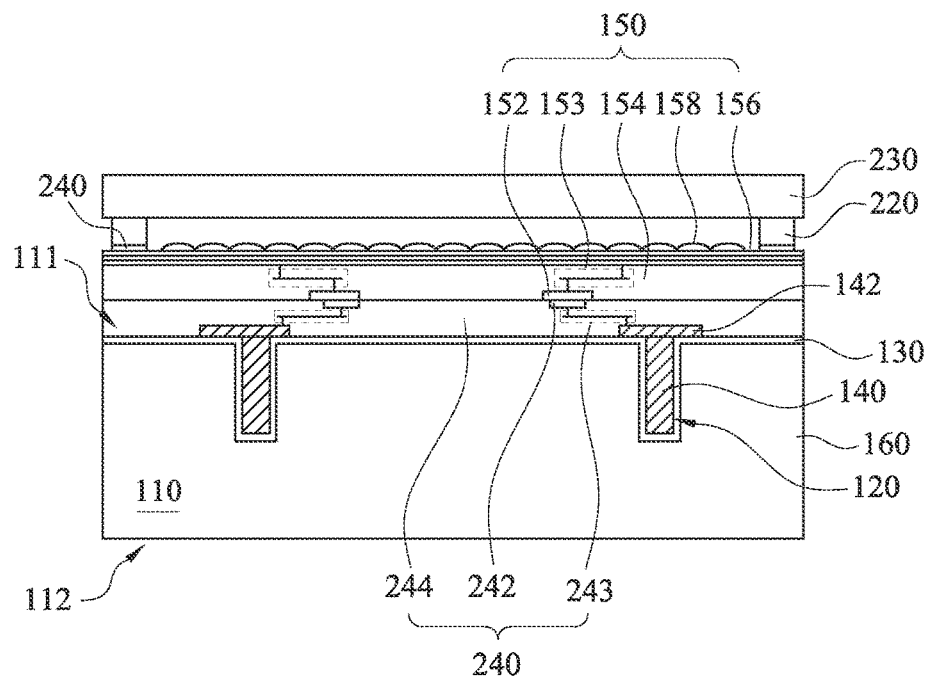
FIG. 11 is a schematic view of the substrate shown in FIG. 10 in a subsequent stage of the method of fabricating the chip package according to another various embodiments of the present disclosure.

FIG. 10 is a schematic view of the substrate shown in FIG. 3 in a subsequent stage of the method of fabricating the chip package according to another various embodiments of the present disclosure. FIG. 11 is a schematic view of the substrate shown in FIG. 10 in a subsequent stage of the method of fabricating the chip package according to another various embodiments of the present disclosure. Referring to FIG. 10, in another various embodiments of the present disclosure, an inter-connection layer 240 is formed on the first isolation layer 130 and the conducting pad 142. As illustrated in FIG. 11, the inter-connection layer 240 includes at least one inter-connection 243 and at least one second connecting pad 242. The second connecting pad 242 is connected to the first connecting pad 152, and the inter-connection 243 connects the second connecting pad 242 and the conducting pad 142. As illustrated in FIG. 11, the inter-connection layer 240 could further include an inter-connection dielectric layer 244. The inter-connection 243 is distributed in the inter-connection dielectric layer 244. It should be noticed that the inter-connection layer 240 is electrically connected to both of the conducting pad 142 disposed on the upper surface 111 of the semiconductor substrate 110 and the first connecting pad 152 of the device 150 through the inter-connection 243 and the second connecting pad 242. Therefore, difference between the conducting pad 142 disposed on the upper surface 111 of the semiconductor substrate 110 and the first connecting pad 152 of the device 150 could be integrated by the inter-connection layer 240. In other words, the layout of the conducting pads 142 and that of the first connecting pads 152 of the device 150 could be different. It is well known that the layout of the first connecting pads 152 of the device 150 would be designed in various parameters for optimized efficiency of the device 150. Therefore, the layout of the first connecting pads 152 of the device 150 could be varied for various requirements. In some cases, the layout of the first connecting pads 152 of the device 150 is not compatible to that of the conducting pad 142 disposed on the upper surface 111 of the semiconductor substrate 110. The inter-connection layer 240 could be regarded as a convert layer between the layout of the first connecting pads 152 of the device 150 and the layout of the conducting pad 142 disposed on the upper surface 111 of the semiconductor substrate 110. In other words, the layout of the second connecting pads 242 is corresponding to that of the first connecting pads 152, and the second connecting pad 242 could be electrically connected to the conducting pad 142 through the inter-connection 243. Therefore, the layout of the first connecting pads 152 is not necessarily fully corresponding to that of the conducting pads 142. Accordingly, design of the first connecting pads 152 of the device 150 could be more flexible for optimizing efficiency of the device 150.

Figure 12:
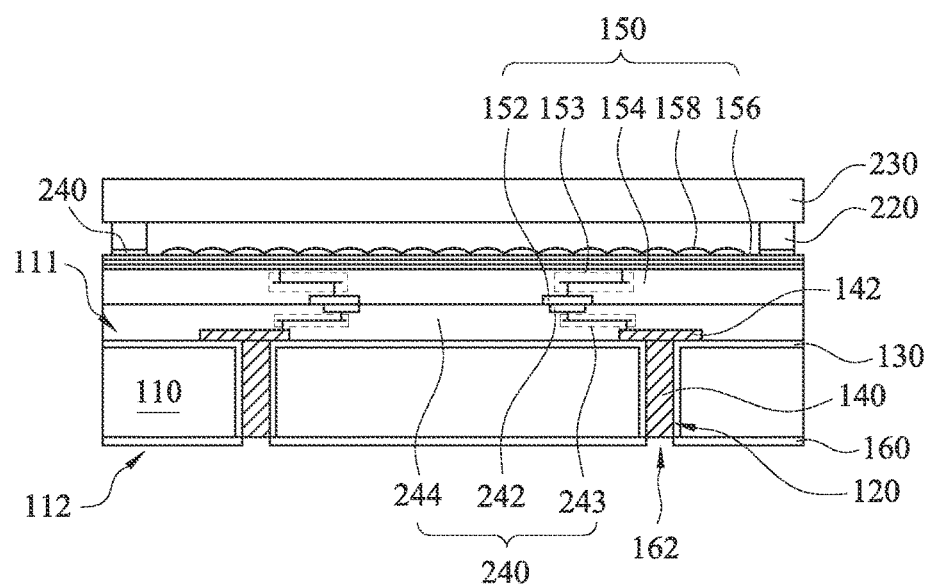
FIG. 12 is a schematic view of the substrate shown in FIG. 11 in a subsequent stage of the method of fabricating the chip package according to another various embodiments of the present disclosure.

FIG. 12 is a schematic view of the substrate shown in FIG. 11 in a subsequent stage of the method of fabricating the chip package according to another various embodiments of the present disclosure. Referring to FIG. 12, the semiconductor substrate 110 is thinned from the lower surface 112 to the upper surface 111 to expose the conductive part 140 disposed in the recess 120. The operation of thinning the semiconductor substrate 110 could be performed by chemical-mechanical polishing (CMP), dry etching, or other suitable processes. However, the present disclosure is not limited thereto. It should be noticed that the operation of thinning the semiconductor substrate 110 exposes the conductive part 140, which is formed in the recess 120, and the vertical conductive path, a through-silicon via (TSV), through the upper surface 111 and the lower surface 112 is formed. Generally, the vertical conductive path is formed by thinning the semiconductor substrate, etching the semiconductor substrate to form a via, and finally fulfilling the via with a conductive material. Among these operations, etching the semiconductor substrate to form the via is performed by etching form a surface to the other surface of the semiconductor substrate, and the etching process has to precisely aim to the conducting pad disposed on the other surface. Therefore, misalignment between the via and the conducting pad disposed on the other surface are easily occurs, and therefore the vertical conductive path is failed to be formed. According to various embodiments of the present disclosure, the device 150 is face-to face connected to the conductive part 140 and the conducting pad 142. Therefore, fabrication of the vertical conductive path through the upper surface 111 and the lower surface 112 is simplified, and the limitations caused by precision of processes are avoided. Accordingly, conductive path of the device 150 in the chip package according to various embodiments of the present disclosure could be formed in a higher yield than that of prior arts. In addition, in prior arts, over-etching is required in forming via through the semiconductor substrate such that exposing the conductive pads could be ensured. Therefore, excess metal loss on some conductive pads is inevitable, and reliability on these conductive pads is reduced accordingly. In contrast, according to various embodiments of the present disclosure, the conductive part 140 and the conducting pad 142 are formed after etching the upper surface 111 of the semiconductor substrate 110 to form the recess 120. Therefore, a connecting surface between the conductive part 140 and the conducting pad 142 is aligned top of the via formed in the recess 120. Therefore, excess metal loss on the conductive pad 142 is avoided, and the reliability of the chip package could be significantly improved. In addition, it should be also noticed that even if the first isolation layer 130 is not formed to cover the bottom of the recess 120, the method of fabricating the chip package according to various embodiments of the present disclosure is not impacted. As aforementioned, it is well known that forming a thin film covering the bottom of the recess is challenging in thin film processes, and expensive tools or complicated process is required to form the thin film covering the bottom of the recess. Since the bottom of the recess 120 is polished away in the operation of thinning the semiconductor substrate 110 from the lower surface 112 to expose the conductive part 140 in the recess 120 from the lower surface 112 such that the vertical conductive path through the semiconductor substrate 110 is formed. Therefore, process window of the method of fabricating the chip package according to various embodiments of the present disclosure is significantly improved. In addition, since the method of fabricating the chip package according to various embodiments of the present disclosure has simpler steps than those of prior arts, cost on fabricating the chip package could be further reduced. As illustrated in FIG. 12, a second isolation layer 160 is formed below the lower surface 112. The second isolation layer 160 has at least one opening 162 to expose the conductive part 140. The second isolation layer 160 could include silicon oxide, silicon nitride, silicon oxynitride, or other suitable isolation materials. The second isolation layer 160 could be formed by chemical vapor deposition, or spin on dielectric. However, the present disclosure is not limited thereto. The second isolation layer 160 is formed below the lower surface 112 to provide electrical isolation and stress buffering between the semiconductor substrate 110 and the redistribution metal line 170 formed in following operations.

Figure 13:
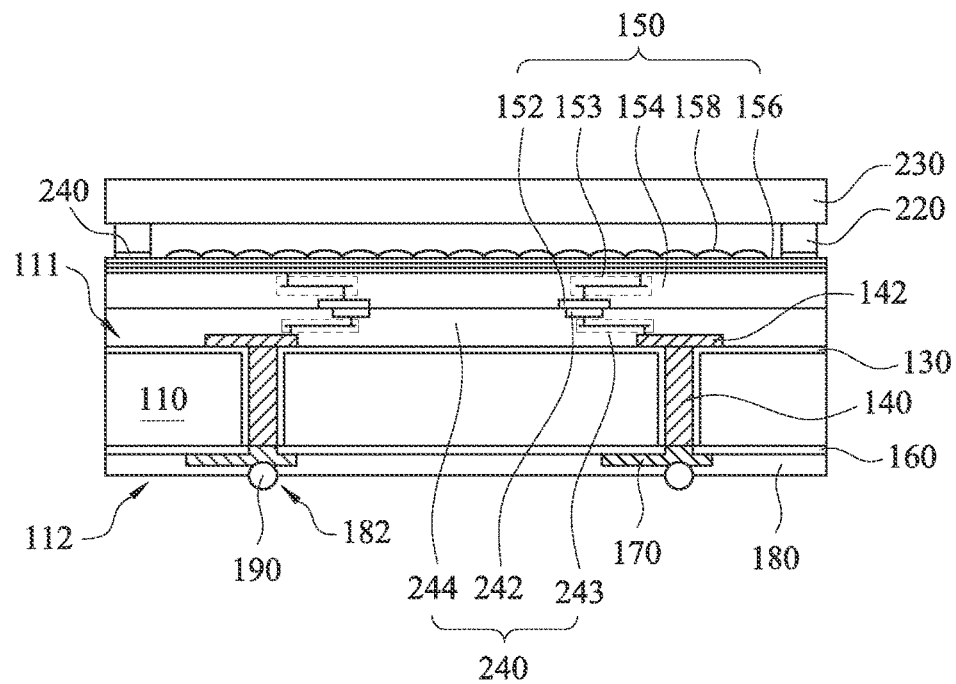
FIG. 13 is a schematic view of the substrate shown in FIG. 12 in a subsequent stage of the method of fabricating the chip package according to another various embodiments of the present disclosure.

FIG. 13 is a schematic view of the substrate shown in FIG. 12 in a subsequent stage of the method of fabricating the chip package according to another various embodiments of the present disclosure. Referring to FIG. 13, at least one redistribution metal line 170 is formed below the second isolation layer 160. A part of the redistribution metal line 170 disposed in the opening 162 is electrically connected to the conductive part 140. The redistribution metal line 170 could include aluminum, copper, nickel, conductive polymer, or other suitable conductive materials. The redistribution metal line 170 could be formed by sputtering, evaporating, electroplating, or electroless plating a conductive film, and litho-etching the conductive film with a predetermined layout corresponding to the conductive part 140 in the opening 162. However, the present disclosure is not limited thereto. As illustrated in FIG. 13, a solder mask layer 180 is formed below the second isolation layer 160 and the redistribution metal line 170. The solder mask layer 180 has at least one opening 182 to expose the redistribution metal line 170. At least one solder ball 190 is formed in the opening 182 to electrically connect the redistribution metal line 170. The solder mask layer 180 could include solder mask, and the solder ball 190 could include tin (Sn) or other suitable soldering materials. The solder ball 190 could further electrically connect to a PCB. The PCB could input and/or output signals to the device 150 in the chip package. The solder ball 190 also could further electrically connect to other semiconductor chips or interposers, and therefore the chip package is integrated as a 3D-IC stacking structure.

Figure 14:
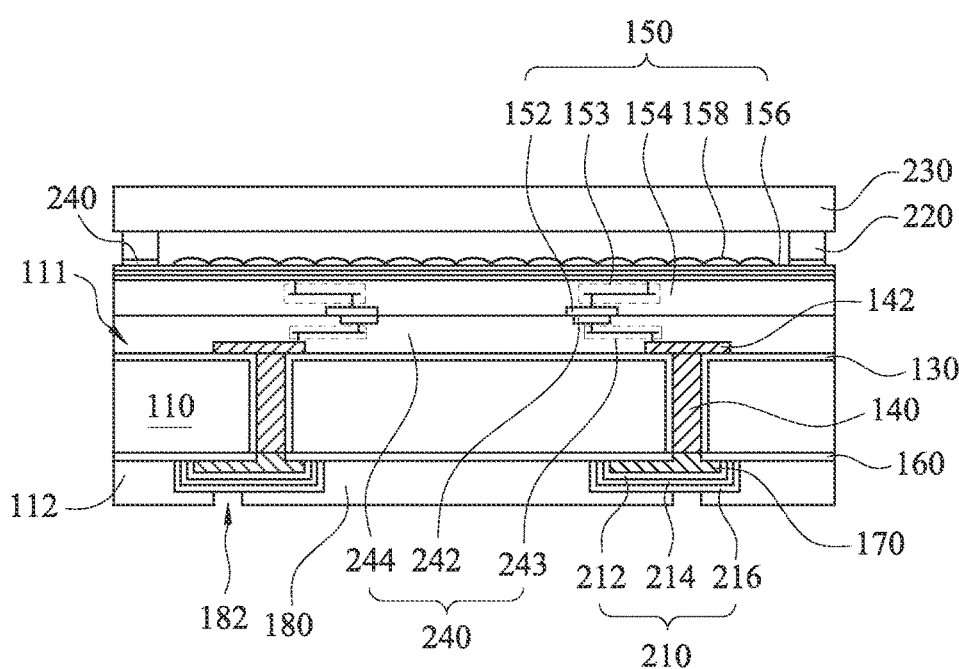
FIG. 14 is a schematic view of the substrate shown in FIG. 13 in a subsequent stage of the method of fabricating the chip package according to another various embodiments of the present disclosure.

FIG. 14 is a schematic view of the substrate shown in FIG. 13 in a subsequent stage of the method of fabricating the chip package according to another various embodiments of the present disclosure. Referring to FIG. 14, a under bump metallization 210 is formed covering the redistribution metal line 170. The under bump metallization 210 can effectively avoid failure of connecting redistribution metal line 170 with the solder ball 190 or a bonding-wire. The under bump metallization 210 could include nickel (Ni) layer 212, which has low consumption rate, to cover the redistribution metal line 170 as a barrier layer. The barrier layer reduces diffusion between the redistribution metal line 170 and the solder ball 190 or the bonding-wire, and risk of forming an intermetallic compound is accordingly reduced. Therefore, bonding fail caused by the intermetallic compound could be avoided. Furthermore, a gold (Au) layer 216 could be formed on the nickel layer 212 as an anti-oxidation layer of the nickel layer 212 since nickel has a higher oxidation potential. As illustrated in FIG. 8, in various embodiments of the present disclosure, the under bump metallization 210 includes a nickel layer 212, a palladium layer 214, and a gold layer 216. The nickel layer 212 covers the redistribution metal line 170. The palladium layer 214 covers the nickel layer 212. The gold layer 216 covers the palladium layer 214. In order to form a good ohmic contact between the under bump metallization 210 and the redistribution metal line 170, a dry clean or wet etching could be performed on the redistribution metal line 170 to remove native oxides on the redistribution metal line 170 before forming the under bump metallization 210. The under bump metallization 210 could be formed by evaporation, sputtering, or chemical plating to form a metal layer, and litho-etching the metal layer. However, the present disclosure is not limited thereto. As illustrated in FIG. 14, a solder mask layer 180 is formed below the second isolation layer 160 and the redistribution metal line 170. The solder mask layer 180 has at least one opening 182 to expose the redistribution metal line 170. Furthermore, a solder ball or a bonding-wire could be formed in the opening 182, and a PCB could be electrically connected to the solder ball or the bonding-wire. The PCB could input and/or output signals to the device 150 in the chip package. The solder ball or the bonding-wire also could further electrically connect to other semiconductor chips or interposers, and therefore the chip package is integrated as a 3D-IC stacking structure.

Besides, as illustrated in FIG. 4-9 and FIG. 11-14, in various embodiments of the present disclosure, the device package further includes a dam 220 and a protection lid 230. The dam 220 and the protection lid 230 protect the device 150 and other circuits in the device package. The protection lid 230 could include glass materials, metal materials, ceramic materials, polymer materials, semiconductor materials, or combinations thereof. The dam 220 is disposed between the protection lid 230 and the device 150. The device 150 is protected in a close system surrounded by the protection lid 230, the dam 220, and the semiconductor substrate 110. The dam 220 could also include glass materials, metal materials, ceramic materials, polymer materials, semiconductor materials, or combinations thereof. The dam 220 could be fixed between the protection lid 230 and the semiconductor substrate 110 with an adhesive layer. The dam 220 could also be the adhesive layer. For example, the dam 220 could include an adhesive polymer, and heating or applying UV lights could cure the adhesive polymer. In various embodiments of the present disclosure, the device package further includes a tape 240 disposed on the device 150. Therefore, the device 150 could also be protected by the tape 240 disposed thereon.

According to various embodiments of the present disclosure, the methods of fabricating the device package have simplified process operations and increased process margin such that the conductive path within the device package could be formed effectively by the methods of fabricating the device package. Therefore, the device package fabricated has higher reliability and lower cost than those of prior arts. In addition, the layout of the connecting pads of the device is not necessarily fully corresponding to that of the conducting pads of the semiconductor substrate. Accordingly, the layout design of the connecting pads of the device could be more flexible for optimizing efficiency of the device.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of fabricating an electronic device package, comprising: providing a semiconductor substrate having an upper surface and a lower surface; forming at least one recess at the upper surface of the semiconductor substrate; forming a first isolation layer on the upper surface and a sidewall of the recess; forming a conductive part fully filling a remaining portion of the recess, and a conducting pad sealing the recess on the first isolation layer to connect the conductive part; combining a device to the upper surface of the semiconductor substrate, wherein the device overlaps the recess, and the device has at least one first connecting pad electrically connecting to the conducting pad; forming at least one dam on the device, wherein the conductive part has a first vertical projection on the upper surface of the semiconductor substrate, the dam has a second vertical projection on the upper surface of the semiconductor substrate, and the first vertical projection is spaced apart from the second vertical projection; forming a protection lid supported by the dam; forming a second isolation layer below the lower surface, wherein the second isolation layer has at least one opening to expose the conductive part; and forming at least one redistribution metal line below the second isolation layer, wherein a part of the redistribution metal line disposed in the opening is electrically connected to the conductive part, wherein the first vertical projection is a projection of a first area defined by the perimeter of the conductive part and the second vertical projection is a projection of a second area defined by a perimeter of the dam, and wherein the first vertical projection is spaced apart from the second vertical projection and the first area and the second area are not overlapping when viewed vertically.

2. The method of claim 1, before combining the device to the upper surface of the semiconductor substrate, further comprising:
forming an inter-connection layer on the first isolation layer and the conducting pad, wherein the inter-connection layer has at least one inter-connection and at least one second connecting pad, the second connecting pad is connected to the first connecting pad, and the inter-connection is connected to the second connecting pad and the conducting pad.

3. The method of claim 1, further comprising:
forming a solder mask layer below the second isolation layer and the redistribution metal line, wherein the solder mask layer has at least one opening to expose the redistribution metal line; and
forming at least one solder ball disposed in the opening to electrically connect the redistribution metal line.

4. The method of claim 3, before forming the solder mask layer, further comprising:
forming an under bump metallization covering the redistribution metal line.

5. The method of claim 4, wherein the forming the under bump metallization is performed by sputtering, vapor deposition, or electroplating.

6. The method of claim 4, wherein the under bump metallization comprising:
a nickel layer covering the redistribution metal line; and
a gold layer covering the nickel layer.

7. The method of claim 4, wherein the under bump metallization comprising:
a nickel layer covering the redistribution metal line;
a palladium layer covering the nickel layer; and
a gold layer covering the palladium layer.

8. The method of claim 1, wherein the dam is disposed between the protection lid and the device.

9. The method of claim 1, further comprising:
attaching a tape on the device.

10. The method of claim 1, wherein forming the first isolation layer and forming the second isolation layer are performed by chemical vapor deposition or spin coating, and the first isolation layer and the second isolation layer comprises silicon oxide, silicon nitride, silicon oxynitride, or combinations thereof.

11. An electronic device package, comprising: a semiconductor substrate having an upper surface and a lower surface; at least one via through the upper surface and the lower surface; a first isolation layer disposed on the upper surface and a sidewall of the via; a conductive part fully filling a remaining portion of the via; a conducting pad disposed on the first isolation layer, and having a connecting surface with the conductive part; an electronic device disposed on the upper surface, wherein the device overlaps the via, and the device has at least one first connecting pad electrically connected to the conducting pad; at least one dam disposed on the device, wherein the conductive part has a first vertical projection on the upper surface of the semiconductor substrate, the dam has a second vertical projection on the upper surface of the semiconductor substrate, and the first vertical projection is spaced apart from the second vertical projection; a protection lid disposed on the dam; a second isolation layer disposed below the lower surface, the second isolation layer having at least one opening to expose the conductive part; and at least one redistribution metal line disposed below the second isolation layer, and a part of the redistribution metal line disposed in the opening to be electrically connected to the conductive part, wherein the connecting surface is aligned top of the via, wherein the first vertical projection is a projection of a first area defined by the perimeter of the conductive part and the second vertical projection is a projection of a second area defined by a perimeter of the dam, and wherein the first vertical projection is spaced apart from the second vertical projection and the first area and the second area are not overlapping when viewed vertically.

12. The electronic device package of claim 11, further comprising:
an inter-connection layer disposed on the first isolation layer and the conducting pad, the inter-connection layer having at least one inter-connection and at least one second connecting pad, wherein the second connecting pad is connected to the first connecting pad, and the inter-connection is connected to the second connecting pad and the conducting pad.

13. The electronic device package of claim 11, further comprising:
a solder mask layer disposed below the second isolation layer and the redistribution metal line, the solder mask layer having at least one opening to expose the redistribution metal line; and
at least one solder ball disposed in the opening to electrically connect the redistribution metal line.

14. The electronic device package of claim 11, further comprising:
an under bump metallization disposed below the redistribution metal line and covering the redistribution metal line;

a solder mask layer disposed below the second isolation layer and the under bump metallization, the solder mask layer having at least one opening to expose the under bump metallization; and at least one solder ball disposed in the opening to be electrically connected to the under bump metallization.

15. The electronic device package of claim 14, wherein the under bump metallization comprises:

a nickel layer covering the redistribution metal line; and a gold layer covering the nickel layer.

16. The electronic device package of claim 14, wherein the under bump metallization comprises:

a nickel layer covering the redistribution metal line;

a palladium layer covering the nickel layer; and a gold layer covering the palladium layer.

17. The electronic device package of claim 14, wherein the dam is disposed between the protection lid and the device.

18. The electronic device package of claim 14, further comprising:

a tape disposed on the device.

19. The electronic device package of claim 14, wherein the first isolation layer and the second isolation layer comprise silicon oxide, silicon nitride, silicon oxynitride, or combinations thereof.

* * * * *